United States Patent
Na et al.

(10) Patent No.: US 8,496,113 B2
(45) Date of Patent: Jul. 30, 2013

(54) INSERT FOR CARRIER BOARD OF TEST HANDLER

(75) Inventors: Yun-Sung Na, Cheonan-si (KR); Tae-Hung Ku, Suwon-si (KR); Jae-Hyun Son, Seoul (KR); Dong-Han Kim, Suwon-si (KR); Young-Yong Kim, Seongnam-si (KR)

(73) Assignee: TechWing Co., Ltd., Hwaseong-si (KR)

( * ) Notice: Subject to any disclaimer, the term of this patent is extended or adjusted under 35 U.S.C. 154(b) by 524 days.

(21) Appl. No.: 12/100,729

(22) Filed: Apr. 10, 2008

(65) Prior Publication Data

US 2008/0253869 A1     Oct. 16, 2008

(30) Foreign Application Priority Data

Apr. 13, 2007  (KR) .................. 10-2007-0036212
Jan. 31, 2008  (KR) .................. 10-2008-0009924

(51) Int. Cl.
*B65D 73/02*    (2006.01)

(52) U.S. Cl.
USPC .................................................. 206/722

(58) Field of Classification Search
USPC ............... 206/710, 711, 713, 714, 715, 716, 206/722, 724, 725; 414/222.01, 222.03; 438/106–127
See application file for complete search history.

(56) References Cited

U.S. PATENT DOCUMENTS

| | | | | |
|---|---|---|---|---|
| 3,454,921 A | * | 7/1969 | Coleman et al. | 439/526 |
| 3,746,157 A | * | 7/1973 | I'Anson | 206/724 |
| 4,535,887 A | * | 8/1985 | Egawa | 206/724 |
| 4,615,441 A | * | 10/1986 | Nakamura | 206/724 |
| 4,725,918 A | * | 2/1988 | Bakker | 361/220 |
| 4,765,471 A | * | 8/1988 | Murphy | 206/719 |
| 5,109,981 A | * | 5/1992 | Maston et al. | 206/719 |
| 5,115,912 A | * | 5/1992 | Murphy | 206/724 |
| 5,742,487 A | | 4/1998 | Kobayashi et al. | |
| 5,783,461 A | * | 7/1998 | Hembree | 438/17 |
| 6,182,829 B1 | * | 2/2001 | Clark et al. | 206/719 |
| 6,627,483 B2 | * | 9/2003 | Ondricek et al. | 438/117 |
| 6,636,060 B1 | | 10/2003 | Saito | |
| 6,651,817 B2 | * | 11/2003 | Shim et al. | 206/726 |
| 7,135,703 B2 | * | 11/2006 | Ham et al. | 257/48 |
| 2007/0296419 A1 | | 12/2007 | Aizawa et al. | |
| 2008/0186015 A1 | | 8/2008 | Osakabe | |

* cited by examiner

*Primary Examiner* — Andrew Perreault
(74) *Attorney, Agent, or Firm* — Jefferson IP Law, LLP

(57) ABSTRACT

An insert for a carrier board of a test handler is disclosed. In a first aspect, the latch block applying to the insert is detachably coupled to the insert body. The latch block can be reused, and thus this reduces wastage of resources and eliminates the insert replacement fee. In a second aspect, the insert pocket having hooks is detachably coupled to the insert body. The insert body can be reused. The latch unit is installed to the insert pocket, so that the damaged latch unit can be easily replaced. The insert forms a plurality of holes in the bottom of the loading part thereof, to expose the leads of the semiconductor devices through the holes downwardly. Thus, the insert can load semiconductor devices regardless of the dimensions of the semiconductor devices.

2 Claims, 21 Drawing Sheets

FIG. 6
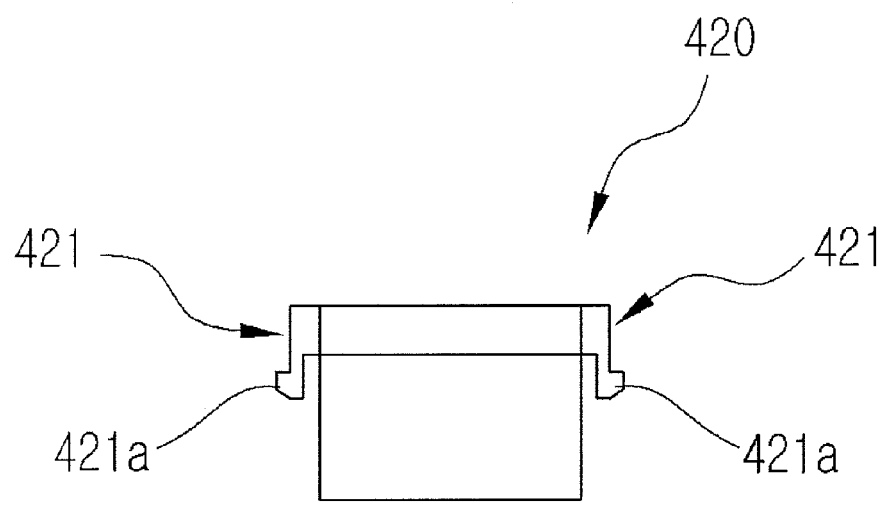
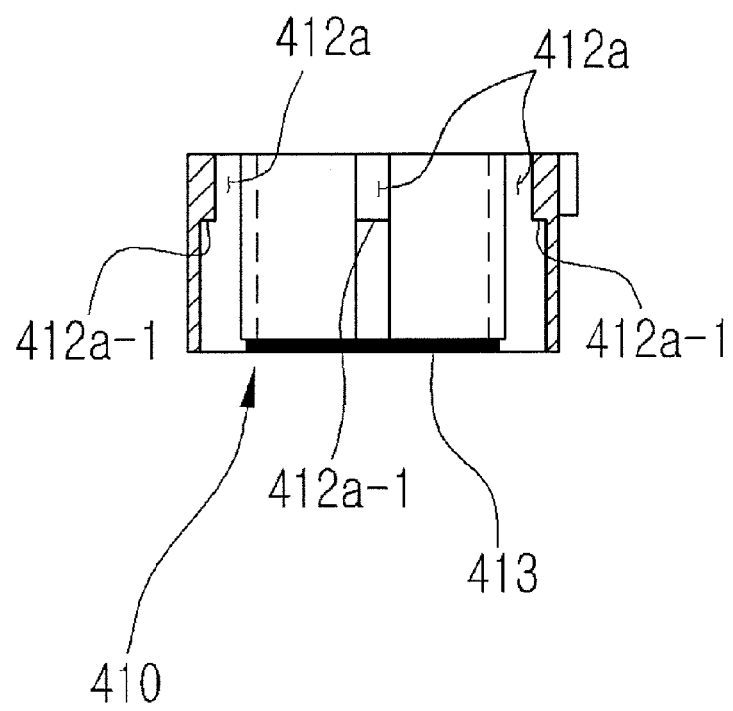

FIG. 10
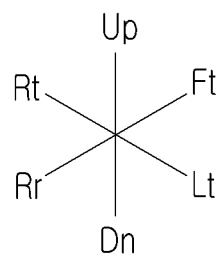
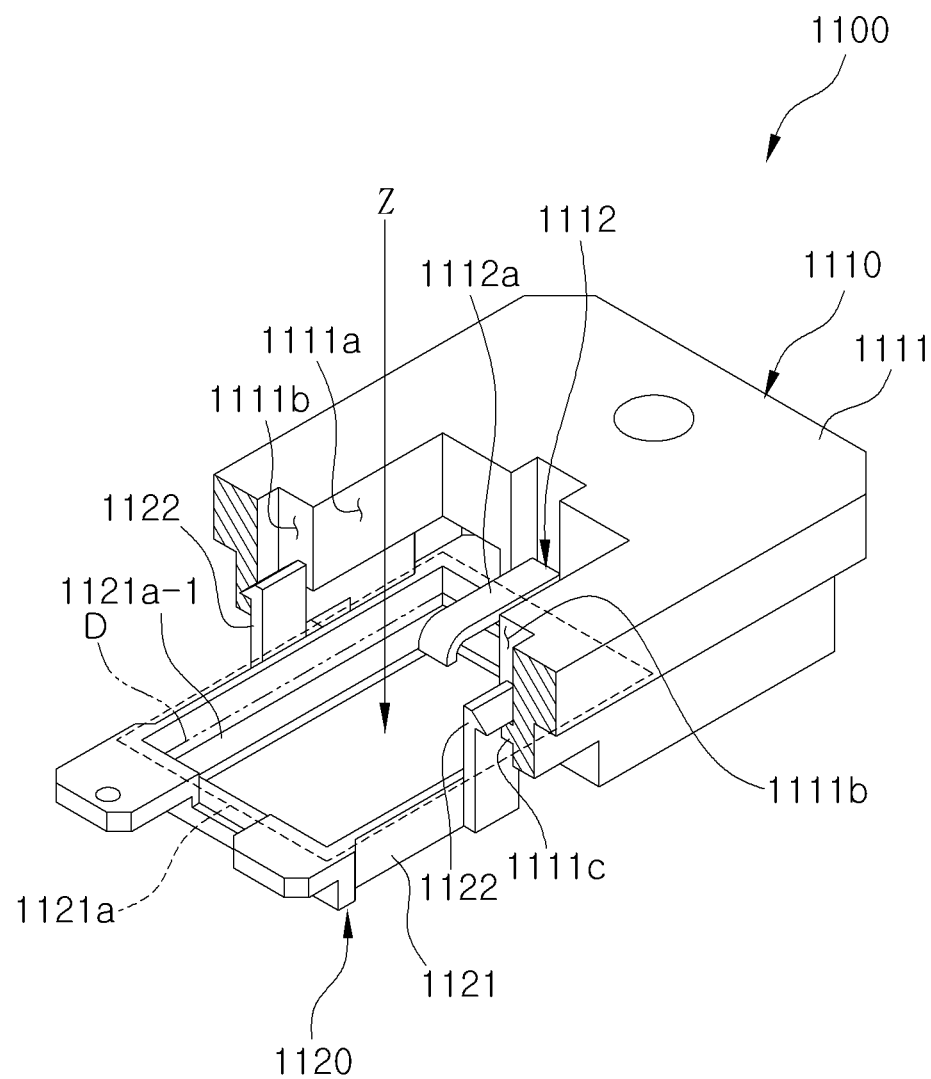

FIG. 11
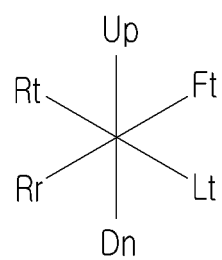
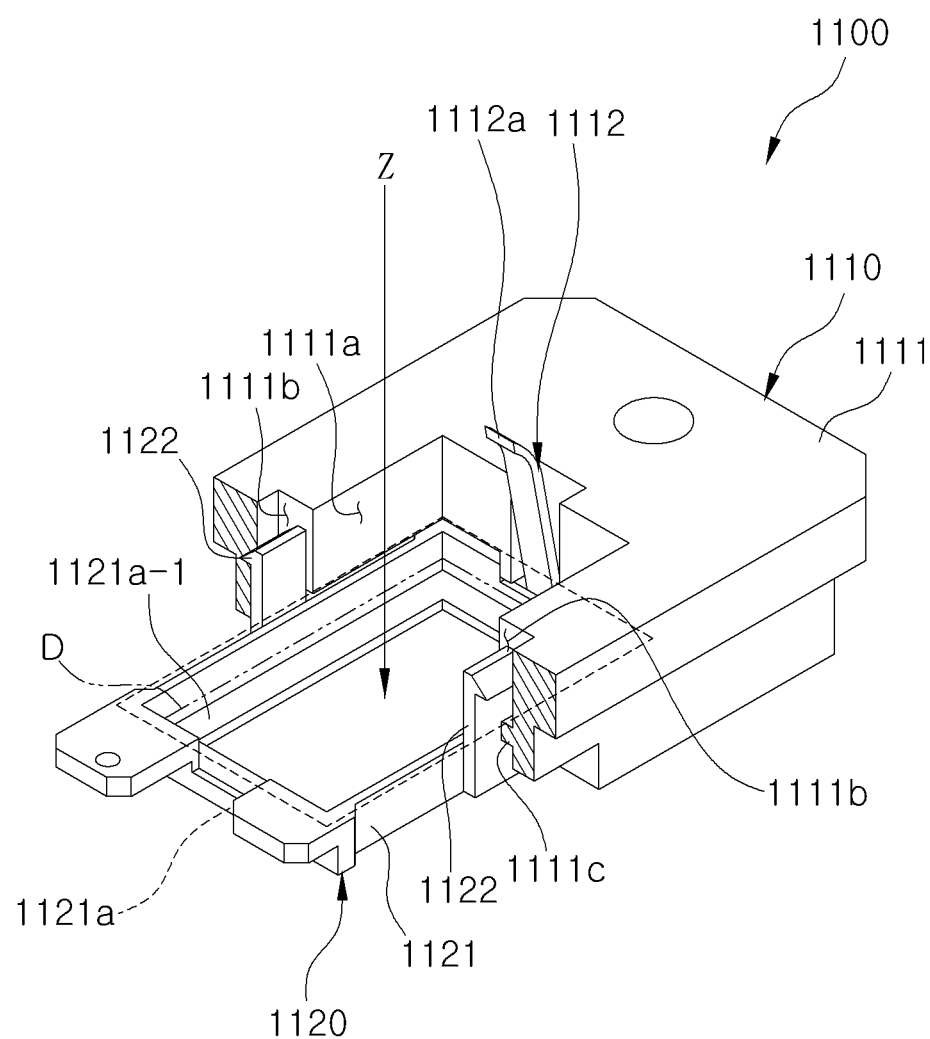

FIG. 13
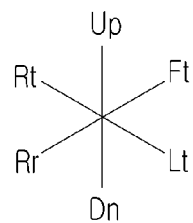
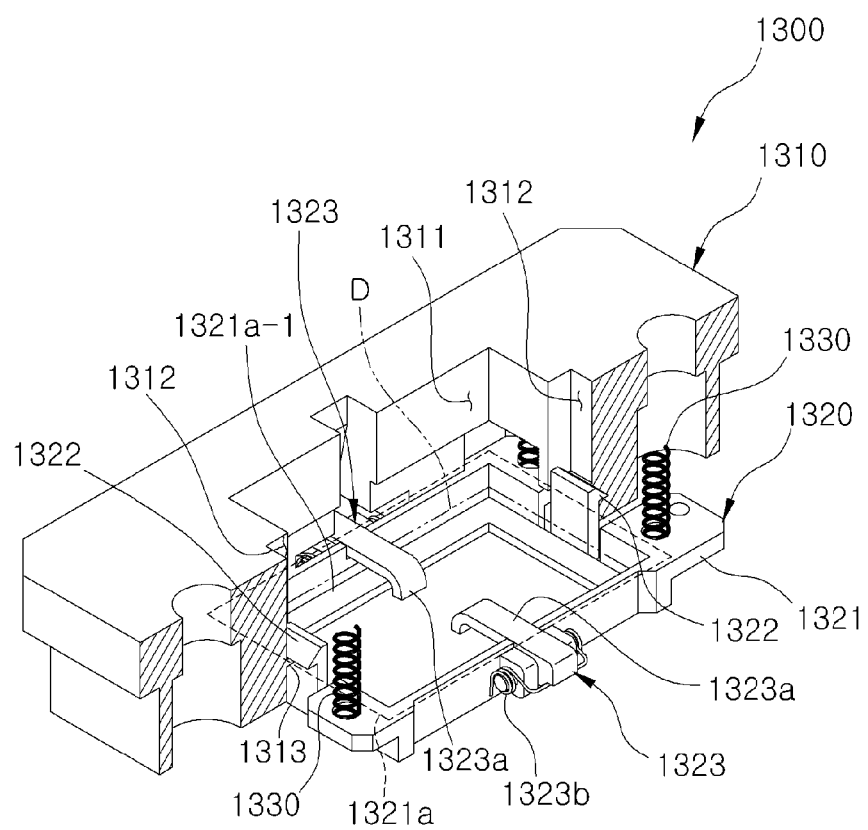

FIG. 14
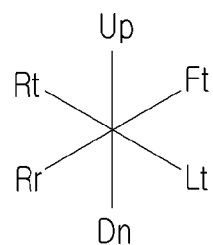
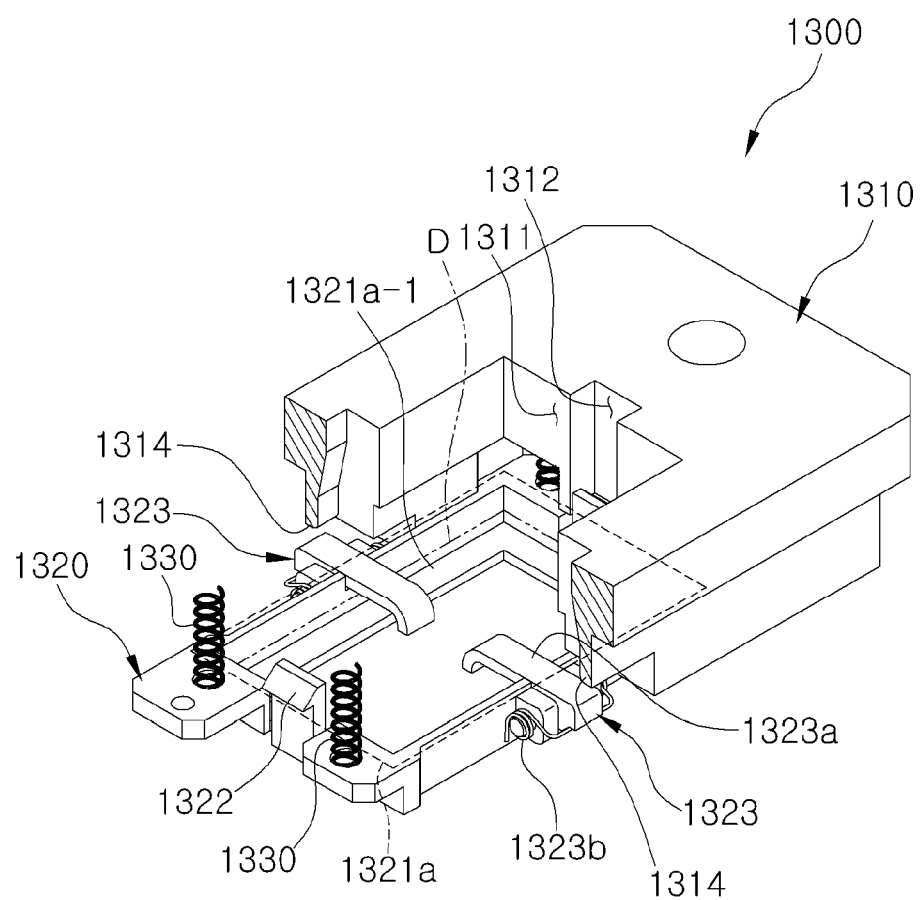

FIG. 17
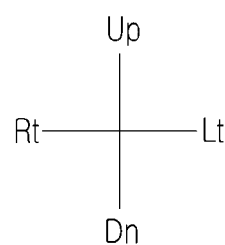
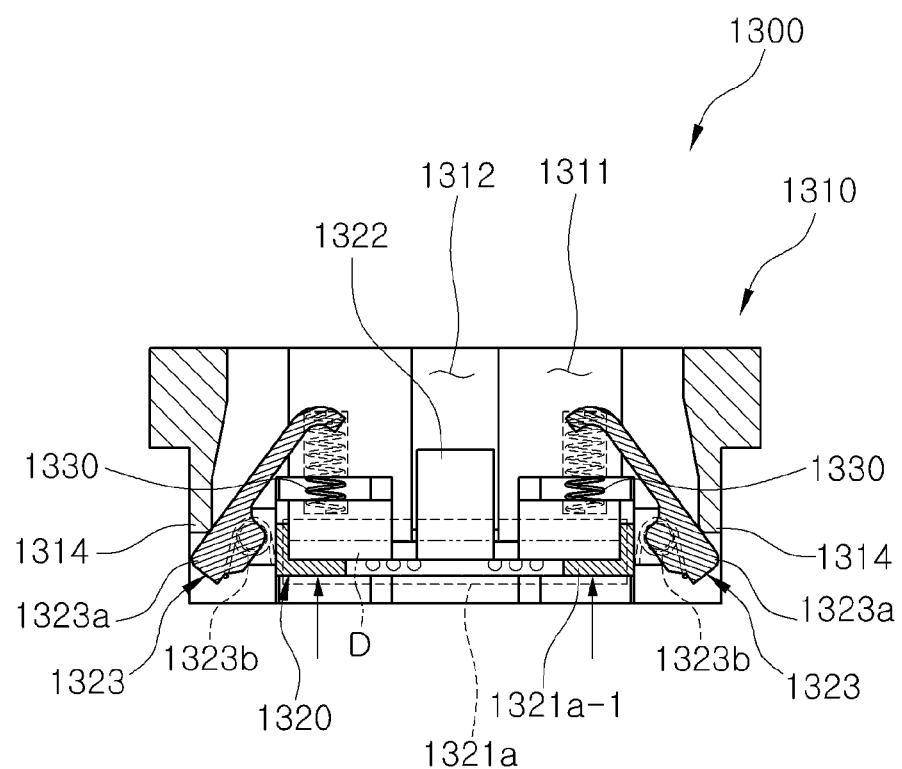

FIG. 18
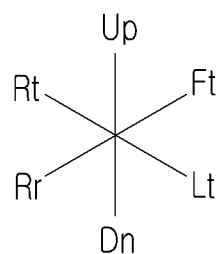
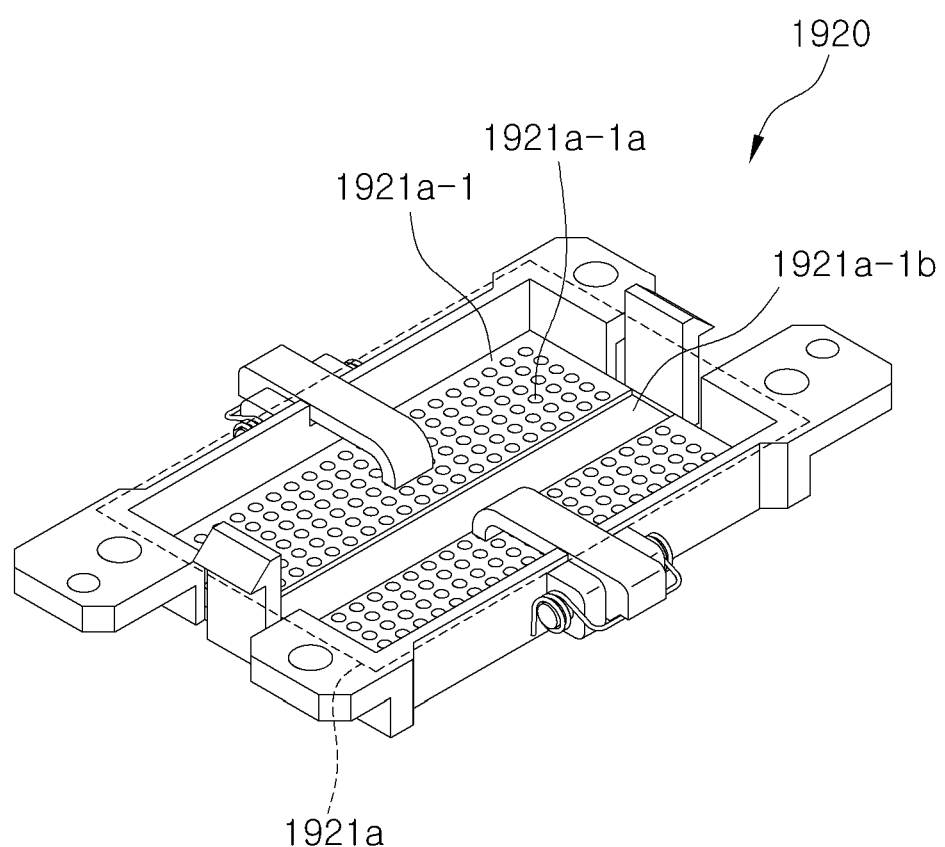

FIG. 19
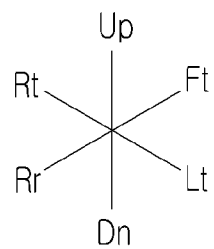
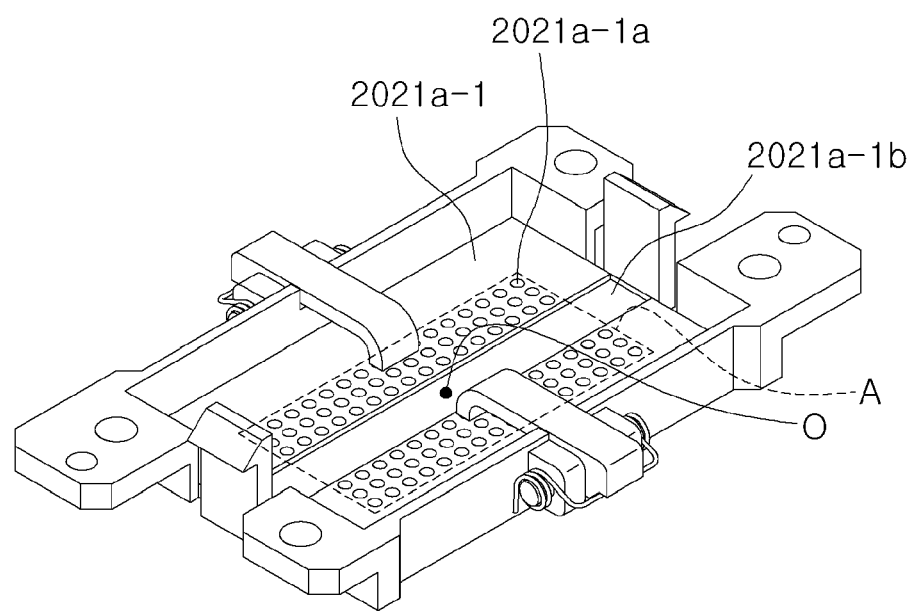

FIG. 20
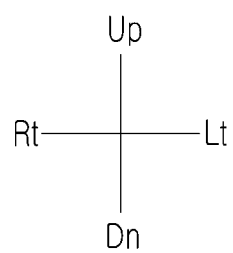
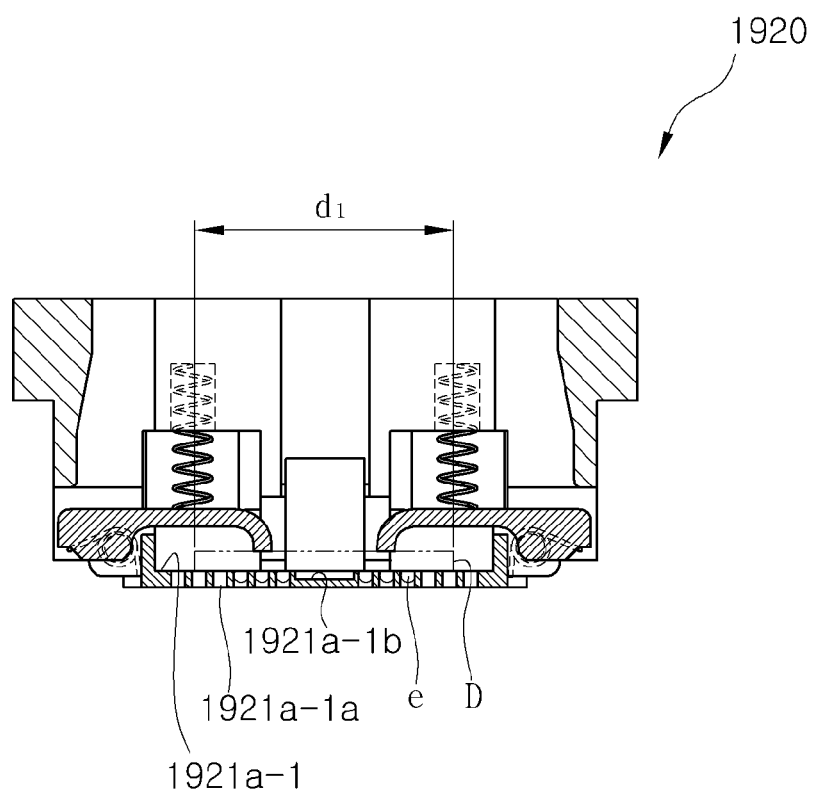

INSERT FOR CARRIER BOARD OF TEST HANDLER

PRIORITY

This application claims the benefit under 35 U.S.C. §119(a) of Korean patent applications filed on Apr. 13, 2007 in the Korean Intellectual Property Office and assigned Serial No. 10-2007-36212, and filed on Jan. 31, 2008 in the Korean Intellectual Property Office and assigned Serial No. 10-2008-09924, and the entire disclosures of both of which are hereby incorporated by reference.

BACKGROUND OF THE INVENTION

1. Field of the Invention The present invention relates to a test handler and, more particularly, to an insert mounted onto a carrier board of a test handler.

2. Description of the Related Art

A test handler is an equipment that transfers produced semiconductor devices to a tester to test the semiconductor devices, and then sorts the tested semiconductor devices according to the test result before the semiconductor devices are sold on the market. Detailed technology related to the test handler has already been disclosed in publications, such as Korean Patent No. 10-0553992.

The test handler is configured to include a plurality of carrier boards (including a 'test tray') that are loaded with semiconductor devices and circulate through a preset path in the test handler.

In general, the test handler loads semiconductor devices from a customer tray onto a carrier board at a loading site, transfers the semiconductor devices loaded onto the carrier board to a tester at a test site, and then unloads the tested semiconductor devices from the carrier board onto a customer tray at an unloading site. To this end, the test handler is configured in such a way so as to allow the carrier boards to circulate through a circulation path that includes a loading site, a test site, and an unloading site.

FIG. 1 is a schematic view illustrating a conventional carrier board. The conventional carrier board 10 is configured in such a way that a plurality of inserts 11 (which is also referred to as a carrier module) are mounted on a frame 12 in a matrix form. One insert 11 is configured that one or more semiconductor devices are placed thereon. In FIG. 1, the insert 11 is shown as an example upon which one semiconductor device is placed.

Since the carrier board circulates through a preset path in the test handler, it includes a holding unit installed to an insert for stably holding semiconductor devices placed onto the insert. The holding unit is hereinafter referred to as a 'latch unit.' Technology related to the latch unit has been disclosed in Korean Patent Publication No. 10-2006-0003893 entitled "INSERT AND TRAY FOR HANDLING ELECTRONIC PARTS, AND ELECTRONIC PART HANDLING APPARATUS," which is called 'Conventional art 1', and Korean Patent Publication No. 10-2006-0125136 entitled "CARRIER MODULE FOR TEST HANDLER OF SEMICONDUCTOR DEVICES," which is called 'Conventional art 2.'

Regarding Conventional art 1:

Referring to FIG. 8 and the corresponding portion disclosed in Korean Patent Publication No. 10-2006-0003893 of Conventional art 1, the latch unit having the latch 164 and elements for operating the latch 164 is separated into parts and installed to the insert, respectively.

Conventional art 1 has the following problems:

When semiconductor devices to be tested are replaced with different sized semiconductor devices and thus the placing compartments of the inserts (corresponding to an IC receiving part 19 in Conventional art 1) are not suited to the replaced semiconductor devices, the inserts or the carrier board must be replaced as a whole. Replacing the carrier board means that its frame and inserts must be also replaced, which wastes both the frame and inserts. Similarly, even though only the inserts are replaced, resources included in the replaced inserts are also wasted.

In general, the unit cost of production of insert is determined by the unit cost of the insert body formed by injection molding (corresponding to the insert bodies 161 and 161' in Conventional art 1), the unit cost of a latch unit, the unit cost of manually assembling a latch and elements for operating latch, which are parts of the latch unit to an insert body, etc.

When semiconductor devices are replaced with different sized semiconductor devices during the use of the inserts of Conventional art 1, the inserts must be replaced. In particular, if the individual parts of the latch unit are to be reused, they must be disassembled and reassembled. However, the parts may be damaged in the disassembling and reassembling processes. Also, the replacement time is increased due to the difficulty of the disassembling and reassembling processes, and thus the rate of operation of the test handler is limited. Since it is substantially difficult to reuse resources in Conventional art 1, Conventional art 1 brings about the wastage of resources.

Regarding Conventional art 2:

Referring to FIG. 4 and the corresponding portion disclosed in Korean Patent Publication No. 10-2006-0125136 of Conventional art 2, the latch (corresponding to the latch 130 in Conventional art 2) and the member for operating a latch, individually separated from the insert body (corresponding to the carrier body 120 in Conventional art 2), are installed to the frame (labeled 110 in Conventional art 2). That is, since the latch and the latch operating member, separated from the insert body, are installed to the frame, they can be reused after the insert body has been replaced.

However, Conventional art 2 has the following problems:

When semiconductor devices to be tested are replaced with small sized semiconductor devices, they cannot be held by the existing latch and the existing latch operating member. This is due to the latch having a limited ability to protrude toward the placing compartment (corresponding to a placing groove or a cavity labeled 122, which are used interchangeably, in Conventional art 2). As shown in FIG. 2, when semiconductor devices to be tested are replaced with small sized semiconductor devices (i.e., semiconductor devices D1 are replaced with small sized semiconductor devices D2), the existing latch 21 and the existing latch operating member cannot hold the replaced semiconductor devices D2.

On the contrary, when semiconductor devices are replaced with large sized semiconductor devices, problems related to the pushers may occur in Conventional art 2. The pushers are a part that serves to push semiconductor devices to the test sockets of the tester at the test site. In general, the pusher has a cross-sectional area almost identical to that of the semiconductor device so as not to partially push the cross-sectional area of the semiconductor device, thereby preventing the micro-cracks in the semiconductor device. However, as shown in FIG. 3, when the semiconductor devices to be tested are replaced with large sized semiconductor devices (i.e., if semiconductor devices D1 are replaced with large sized semiconductor devices D3), the pushers P cannot push the semiconductor devices D3 around their edges due to the obstruction of the latch 21.

Also, when semiconductor devices are replaced with large sized semiconductor devices, especially if the size difference is large between the existing semiconductor devices and the replaced semiconductor devices, the replaced semiconductor devices cannot be placed onto the placing compartments of Conventional art 2. That is, when the replaced semiconductor devices are so large that they exceed a preset area of latch, they cannot be placed onto the placing compartment due to the latches. In that case, the latches and the latch operating members must be replaced with different sized latches and a different-sized latch operating members, respectively.

Therefore, when the semiconductor devices are replaced with different sized semiconductor devices, the latches and the latch operating members must be replaced in conventional art 2. Also, the parts included in the latches and the latch operating members must be replaced individually and respectively.

In addition, technology related to the carrier board, insert, and latch unit has been disclosed in Korean Patent No. 10-0486412 entitled "INSERT FOR TEST TRAY OF TEST HANDLER," in which a carrier board is defined as a 'test tray,' which is called 'Cited art 1', and Korean Patent No. 10-0769105 entitled "INSERT AND ELECTRONIC PART HANDLING APPARATUS INCLUDING THE INSERT," which is called 'Cited art 2.' The insert body is detachably coupled to the insert pocket (which is defined as a 'guide core' in cited art 2).

Cited art 2 discloses that the insert body is configured to include a hook mechanism and a latch mechanism, and the insert pocket loads semiconductor devices thereonto. Therefore, although semiconductor devices are replaced with different sized semiconductor devices, only the insert pocket is replaced but the insert body can be reused.

However, in cited arts 2, if the hook mechanism is damaged, the insert body must be replaced. Also, when semiconductor devices to be tested are replaced with different sized semiconductor devices, the insert pocket, one of the parts of the insert, must be replaced. Therefore, cited arts 2 still have a low reuse rate of resources.

In addition, since the parts included in the latch mechanism are small and complicated, installing and disassembling them is difficult. That is, it is difficult to install and replace the latch mechanism. These problems still exist in conventional arts.

SUMMARY OF THE INVENTION

The present invention solves the above problems, and provides technology where a latch block, formed as a module, can be detachably coupled to the insert body.

The present invention further provides technology where a hook, which is easily damageable in an insert that can be detachably coupled to an insert pocket, is installed to an insert pocket, technology where an insert or parts of the insert are not replaced but reused although semiconductor devices to be tested are replaced with different sized semiconductor devices, and technology where a latch unit, which tends to be easily malfunctioned in an insert that can be detachably coupled to in insert pocket, is installed to the insert pocket.

In accordance with an exemplary embodiment of the present invention, the present invention provides an insert for a carrier board of a test handler that includes an insert body having a placing compartment in which a semiconductor device is placed, and at least one latch block for holding the semiconductor device placed in the placing compartment, wherein the at least one latch block is formed as a module and detachably coupled to the insert body.

Preferably, the insert body forms at least one block receiving opening in which the at least one latch block is received. The latch block is formed to be received in the block receiving opening.

Preferably, the insert body forms at least one catching jaw on the inner wall of the block receiving opening. The latch block forms at least one catching boss which is elastically and movably caught to the catching jaws to prevent the latch block from separating when the latch block is received in the block receiving opening.

Preferably, the latch block is detachably coupled to the insert body through a coupling member.

Preferably, the at least one latch block can be coupled to various insert bodies having placing compartments of each in which different dimensional semiconductor devices can be placed.

Preferably, the bottom of the loading part forms a plurality of holes through which leads of the semiconductor device are exposed downwardly.

Preferably, the plurality of holes are formed spaced apart from each other at a certain distance, so that different sized semiconductor devices, whose leads are spaced apart from each other at the same as the distance between the plurality of holes, can be loaded onto the loading part.

In accordance with another exemplary embodiment of the present invention, the present invention provides an insert for a carrier board of a test handler that includes an insert body having a through-hole that allows a semiconductor device to be loaded to pass therethrough, and an insert pocket that is detachably coupled to the insert body and has a loading part onto which the semiconductor device passing through the through-hole is loaded. Here, the insert pocket includes at least one or more hooks, by which the insert pocket can be detachably coupled to the insert body, at sides of the loading part. Also, the insert body forms at least one or more hook receiving grooves on sides of the through-hole, which can receive the at least one or more hooks, respectively, and at least one or more hook catching jaws for catching at least one or more hooks, respectively.

Preferably, the loading part forms a position groove on the bottom thereof, to hold a position of the loaded semiconductor device.

Preferably, the bottom of the loading part forms a plurality of holes through which leads of the semiconductor device are exposed downwardly.

Preferably, the plurality of holes are formed spaced apart from each other at a certain distance, so that different sized semiconductor devices, whose leads are spaced apart from each other at the same as the distance between the plurality of holes, can be loaded onto the loading part.

Preferably, the insert body includes at least one or more latch units installed on the sidewalls of the through-hole to hold or release the semiconductor device loaded onto the loading part. The at least one or more latch units hold or release the semiconductor device as the insert pocket is lifted up or lowered.

Preferably, the insert body includes at least one or more latch units installed on the sidewalls of the through-hole to hold or release the semiconductor device loaded onto the loading part. The at least one or more latch units hold or release the semiconductor device by applying a pressure from below. Also, the semiconductor device is lowered, for loading, onto the loading part from the upper direction.

In accordance with another exemplary embodiment of the present invention, the present invention provides an insert for a carrier board of a test handler, which includes a loading part onto which a semiconductor device is loaded, in which the loading part forms a position groove to hold the semiconductor device loaded onto the loading part.

Preferably, the bottom of the loading part forms a plurality of holes through which leads of the semiconductor device are exposed downwardly.

Preferably, the plurality of holes are formed spaced apart from each other at a certain distance, so that different sized semiconductor devices, whose leads are spaced apart from each other at the same as the distance between the plurality of holes, can be loaded onto the loading part.

In accordance with another exemplary embodiment of the present invention, the present invention provides an insert for a carrier board of a test handler that comprises an insert body having a through-hole through which a semiconductor device to be loaded passes, and an insert pocket having a loading part onto which the semiconductor device passing through the through-hole is loaded, the insert pocket being detachably coupled to the insert body. Here, the insert pocket includes a loading frame having the loading part, and at least one or more latch units installed on the wall sides of the loading frame to hold or release the semiconductor device loaded onto the loading part.

Preferably, the at least one or more latch unit includes a latch bar which is pivotally coupled to the side of the loading frame and whose one end rotates with respect to the pivot operating as a rotation axis, for holding or releasing the semiconductor device loaded onto the loading part, and a holding spring for applying an elastic force to the latch bar so that the latch bar can maintain its holding state.

Preferably, the insert pocket is coupled to the insert body to be movable a certain distance in the vertical direction with respect to the loading part. Also, the opposite end of the latch bar protrudently extends from the rotation axis in the length direction of the latch bar. In addition, the insert body has a latch catching jaw by which the extended portion of the opposite end of the latch bar is caught so that the latch bar is rotated when the insert pocket is lifted up.

Preferably, the insert may further include a compression spring for applying a repulsive elastic force between the insert body and the insert pocket.

Preferably, the loading part forms a position groove on the bottom thereof, to hold the loaded semiconductor device.

Preferably, the bottom of the loading part forms a plurality of holes through which leads of the semiconductor device are exposed downwardly.

Preferably, the plurality of holes are formed spaced apart from each other at a certain distance, so that different sized semiconductor devices, whose leads are spaced apart from each other at the same as the distance between the plurality of holes, can be loaded onto the loading part.

BRIEF DESCRIPTION OF THE DRAWINGS

The features and advantages of the present invention will be more apparent from the following detailed description in conjunction with the accompanying drawings, in which:

FIG. 6 is a cross-sectional view of the insert of FIG. 4, taken along the J-J direction, as seen in the B direction;

FIG. 10 is a partially cut-away perspective view illustrating a first embodiment of an insert in accordance with a second aspect of the present invention;

FIG. 11 is a view explaining an operation state of the first embodiment of the insert of FIG. 10;

FIG. 13 and FIG. 14 are partially cut-away perspective views of the second embodiment of FIG. 12;

FIG. 15 to FIG. 17 are views which illustrate operation states of the second embodiment of FIG. 12;

FIG. 18 is a perspective view illustrating an insert pocket adapted to a third embodiment of an insert in accordance with a second aspect of the present invention;

FIG. 19 is a perspective view illustrating an insert pocket modified from the one of FIG. 18; and FIG. 20 and FIG. 21 show use states for illustrating the features of the insert pocket of FIG. 18.

Throughout the drawings, like reference numerals will be understood to refer to like parts, components and structures.

BRIEF DESCRIPTION OF SYMBOLS IN THE DRAWINGS

Figure 1:
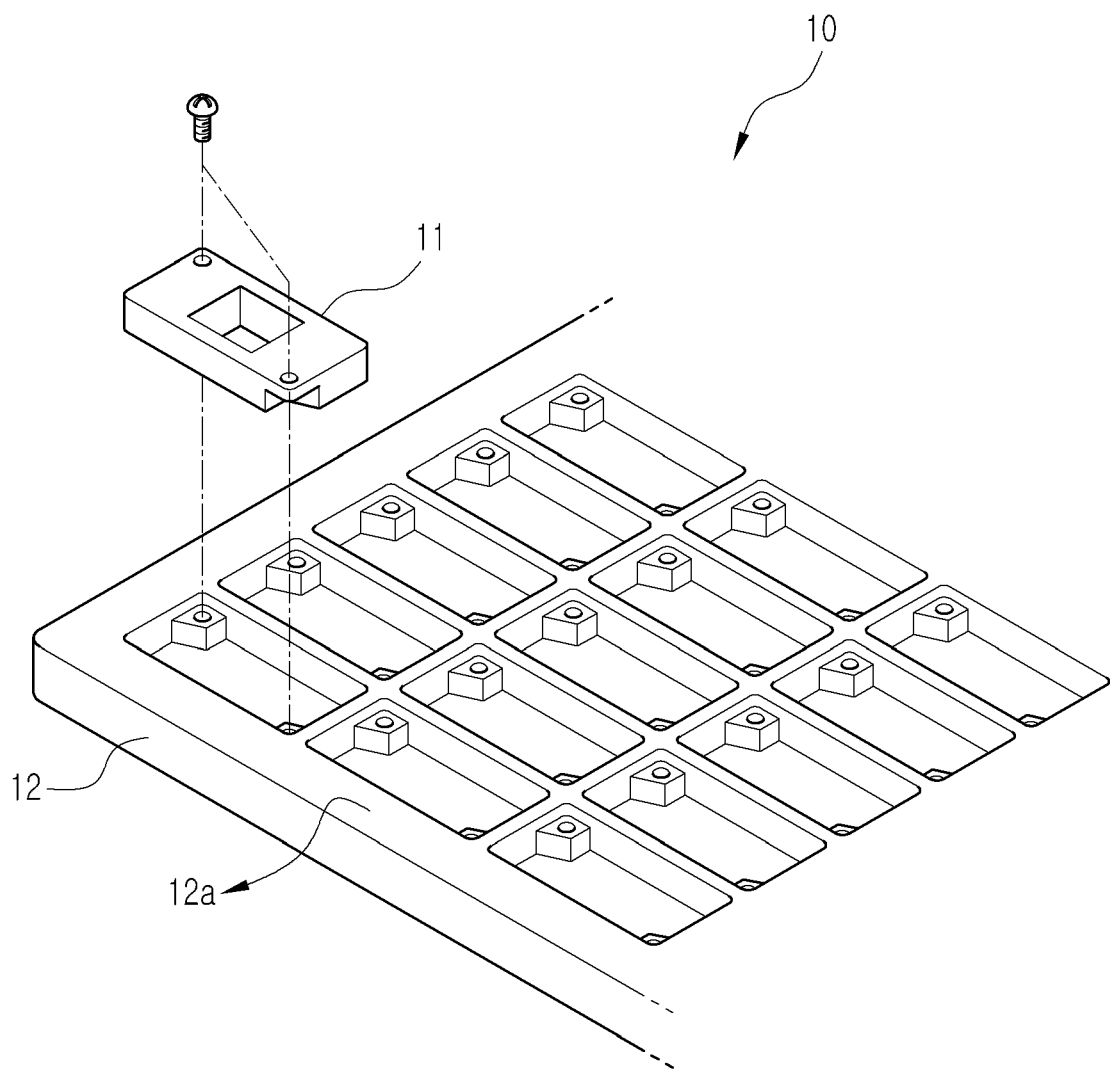
FIG. 1 is a schematic view illustrating a conventional carrier board.
Figure 2:
FIG. 2 and FIG. 3 are views for explaining a problem in a conventional art 2.
Figure 3:
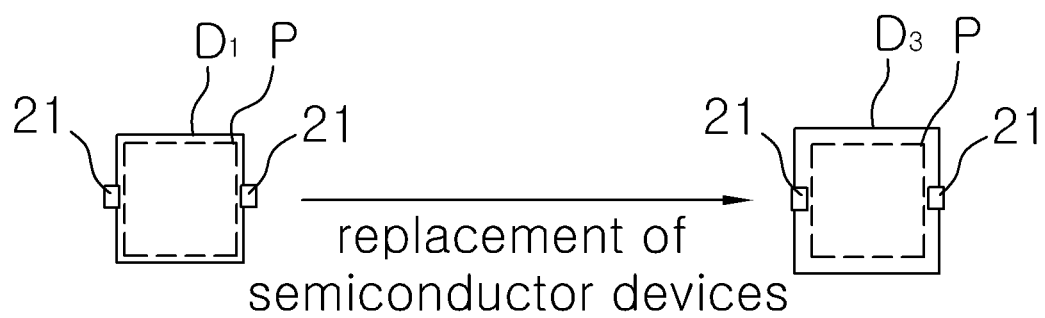

400, 400', 1300: insert
410, 410': insert body
411: placing compartment
412: block-receiving opening
412a: locking groove
412a-1: catching jaw
420, 420': latch block
421: catching portion
421a: catching boss
421': bolt
1310: insert body
1320: insert pocket
1322: hook
1323: latch unit
1330: compression spring
2021a-1: bottom surface
2021a-1a: open hole
2021a-1b: position groove

DETAILED DESCRIPTION OF EXEMPLARY EMBODIMENTS

Hereinafter, exemplary embodiments of an insert for a carrier board of a test handler according to the present invention are described in detail with reference to the accompanying drawings. The insert for a carrier board of a test handler is hereinafter referred to as an "insert." The same reference numbers are used throughout the drawings to refer to the same or similar parts. Detailed descriptions of well-known functions and structures incorporated herein or redundant descriptions may be omitted to avoid obscuring the subject matter of the present invention.

First Aspect of the Present Invention

Figure 4:
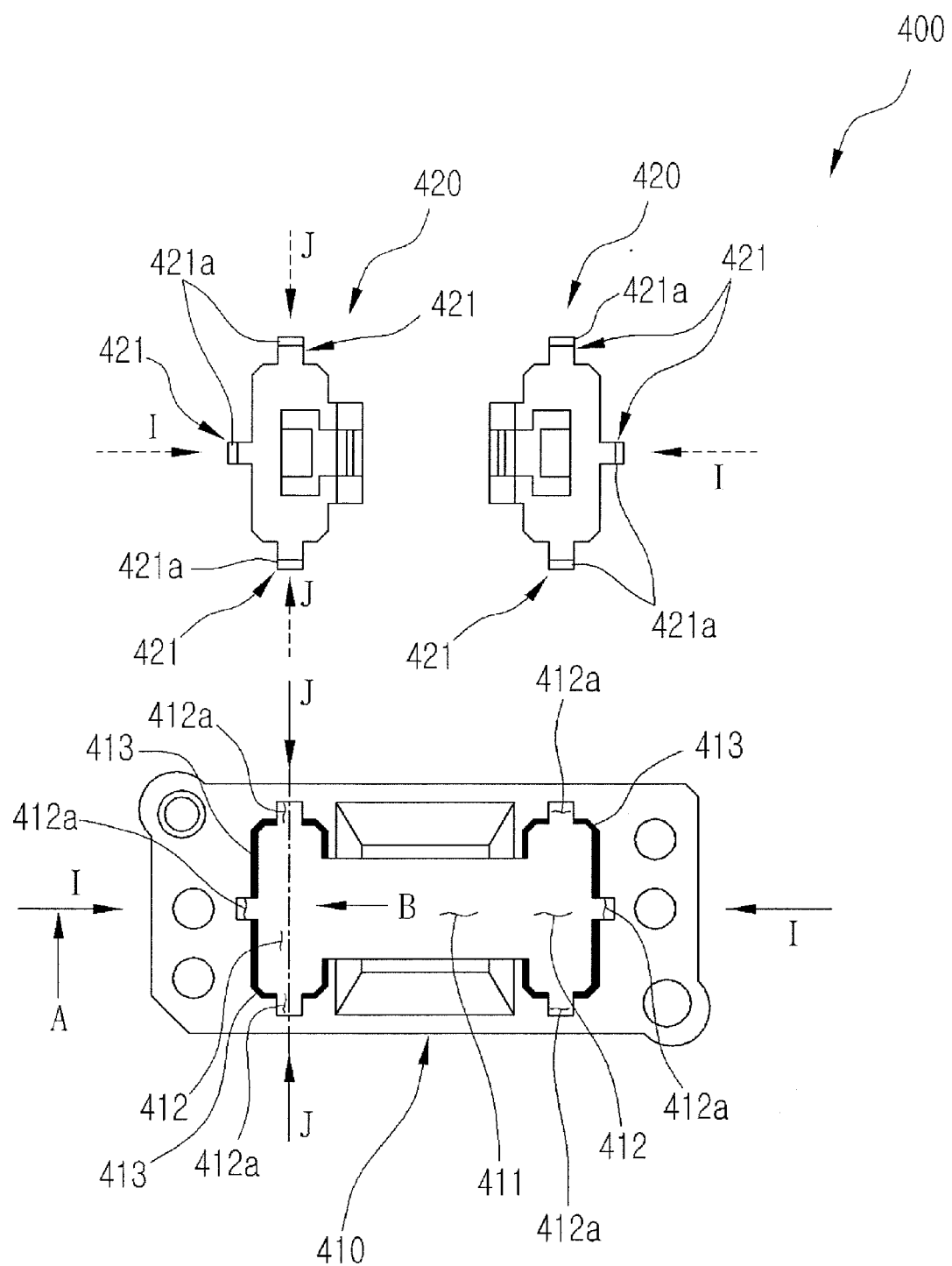
FIG. 4 is a plan view illustrating an embodiment of an insert in accordance with a first aspect of the present invention.
Figure 5:
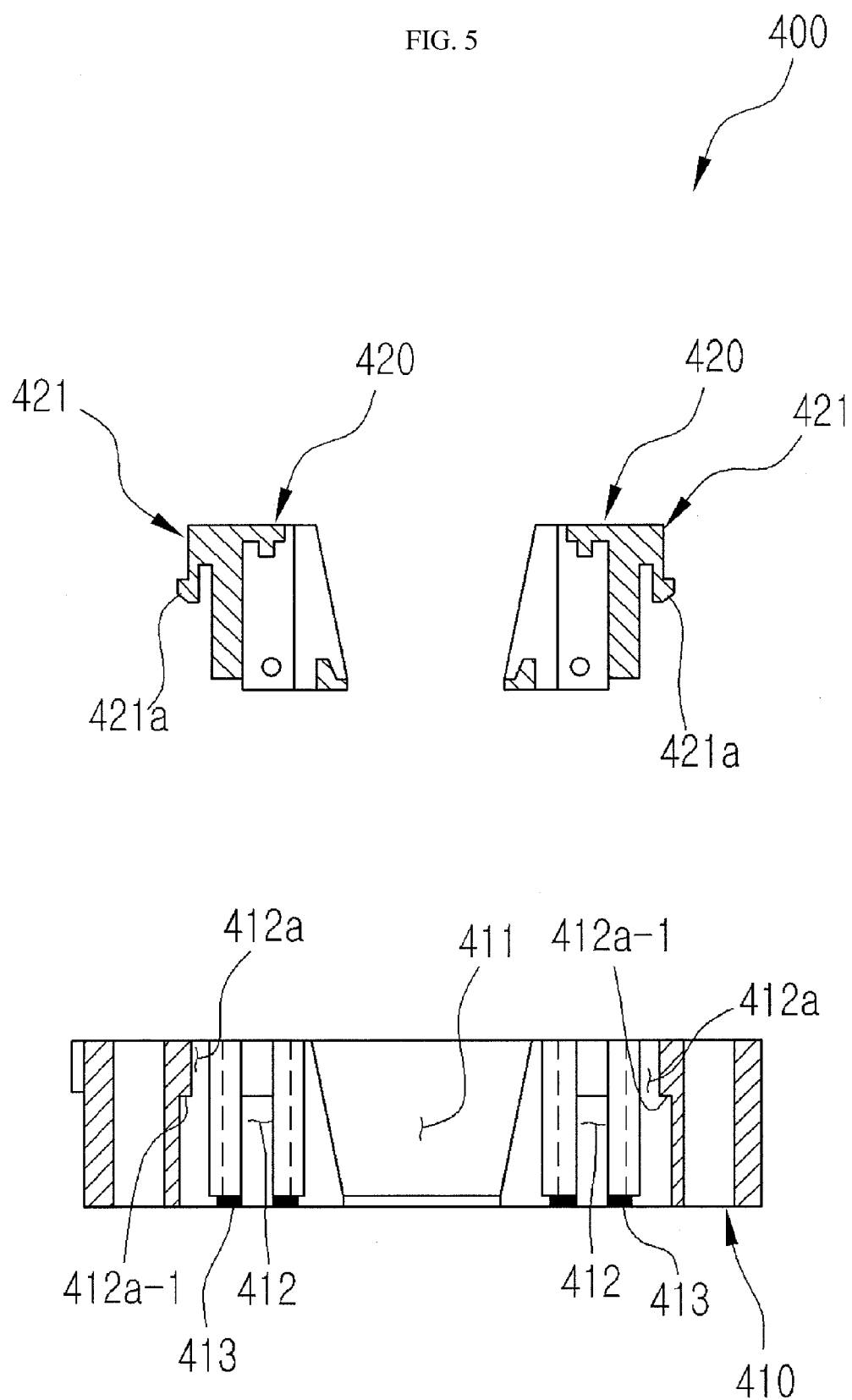
FIG. 5 is a cross-sectional view of the insert of FIG. 4, taken along the I-I direction, as seen in the A direction.

FIG. 4 is a plan view of an embodiment of an insert 400 in accordance with a first aspect of the present invention, illustrating an insert body 410 and latch blocks 420 of an insert 400. FIG. 5 is a cross-sectional view of the insert body 410 and the latch block 420 of the insert 400 of FIG. 4, taken along the I-I direction, as seen in the A direction. FIG. 6 is a cross-sectional view of the insert body 410 and the latch block 420 of the insert 400 of FIG. 4, taken along the J-J direction, as seen in the B direction.

As shown in FIG. 4 to FIG. 6, the insert 400 includes an insert body 410 and a latch block 420.

The insert body 410 is configured in such a way that a placing compartment 411 in which a semiconductor device can be placed is formed, and block receiving openings 412 for receiving latch blocks 420 are formed at both of the opposite sides of the placing compartment 411, in which the block receiving openings 412 are each open in the upper and lower directions and toward the placing compartment 411. Each block receiving opening 412 forms locking grooves 412a on three side walls except for the direction toward the placing compartment 411, so that the locking grooves 412a can be coupled by a catching portion 421 of the latch block 420 which will be described later. Each locking groove 412a, as shown in FIG. 5, has a step on the wall thereof, forming a catching jaw 412a-1. Also, the block receiving opening 412 forms a lower protrusion 413 at the lower side thereof. The lower protrusion 413 supports the bottom of the latch block 420 so that the latch block 420 cannot slip downward from the lock receiving opening 412 when the latch block 420 is placed in the block receiving opening 412.

The latch block 420 forms a module in which a latch and parts for operating a latch are integrally assembled to hold a semiconductor device placed in the placing compartment 411. The latch block 420 is received in the latch receiving opening 412 of the insert body 410.

The latch block 420 forms a catching portion 421 on its three side walls except for its side wall facing the placing compartment 411. The catching portion 421, as shown in FIG. 5, has a catching boss 421a at its end, which can be elastically and movably caught to the catching jaw 412a-1. The present embodiment is implemented in such a way that one latch block 420 has three catching portions 421, however, it should be understood that the present invention can be also implemented by only one or more catching portions 421.

Figure 7:
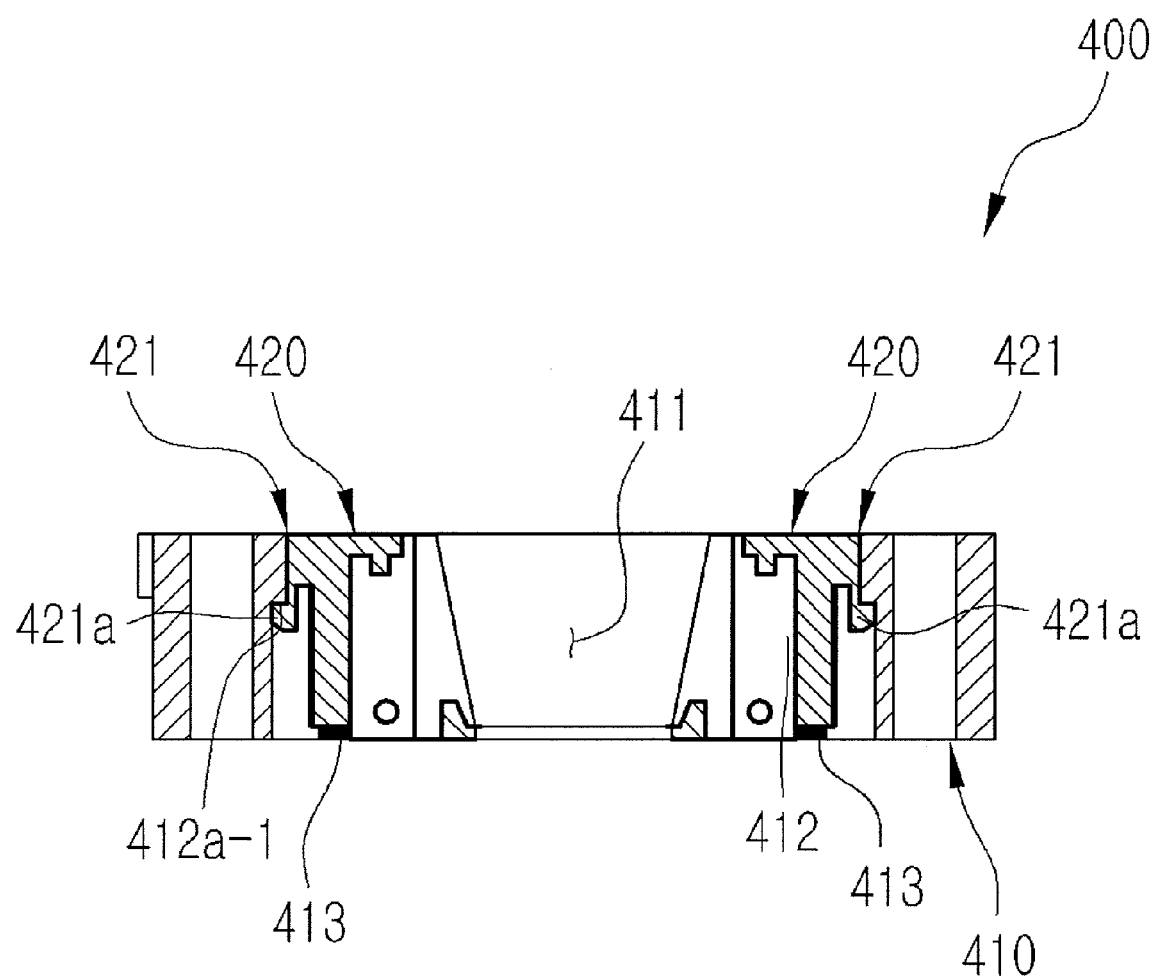
FIG. 7 is a cross-sectional view illustrating the insert of FIG. 4 in an assembled state.

The latch block 420 and the insert body 410, separated as shown in FIG. 5, are assembled into the insert 400, as shown in FIG. 7, as the latch block 420 is inserted to the block receiving opening 412 of the insert body 410. That is, when the latch block 420 is inserted into the block receiving opening 412, the bottom of the latch block 420 is caught by the bottom protrusion 413 and the catching boss 421a is also caught by the catching jaw 412a-1. Therefore, the latch block 420 is stably coupled to the insert body 410 without separating from the insert body 410 upward or downward, as shown in FIG. 7.

When semiconductor devices are replaced with different sized semiconductor devices and thus the inserts 400 need to be replaced, the catching boss 421a is released from the catching jaw 412a-1 using a pin or a jig in the lower direction of the block receiving opening 412, thereby easily separating the latch block 420 from the block receiving opening 412. After that, the separated latch block 420 can be coupled to a newly replaced insert body.

According to the present embodiment, by standardizing the block receiving opening 412 of the insert body 410, the latch block 420 can be applied to various insert bodies having the standardized block receiving opening 412. Therefore, according to the present embodiment, the latch block 420 can be easily reused and replaced.

Figure 8:
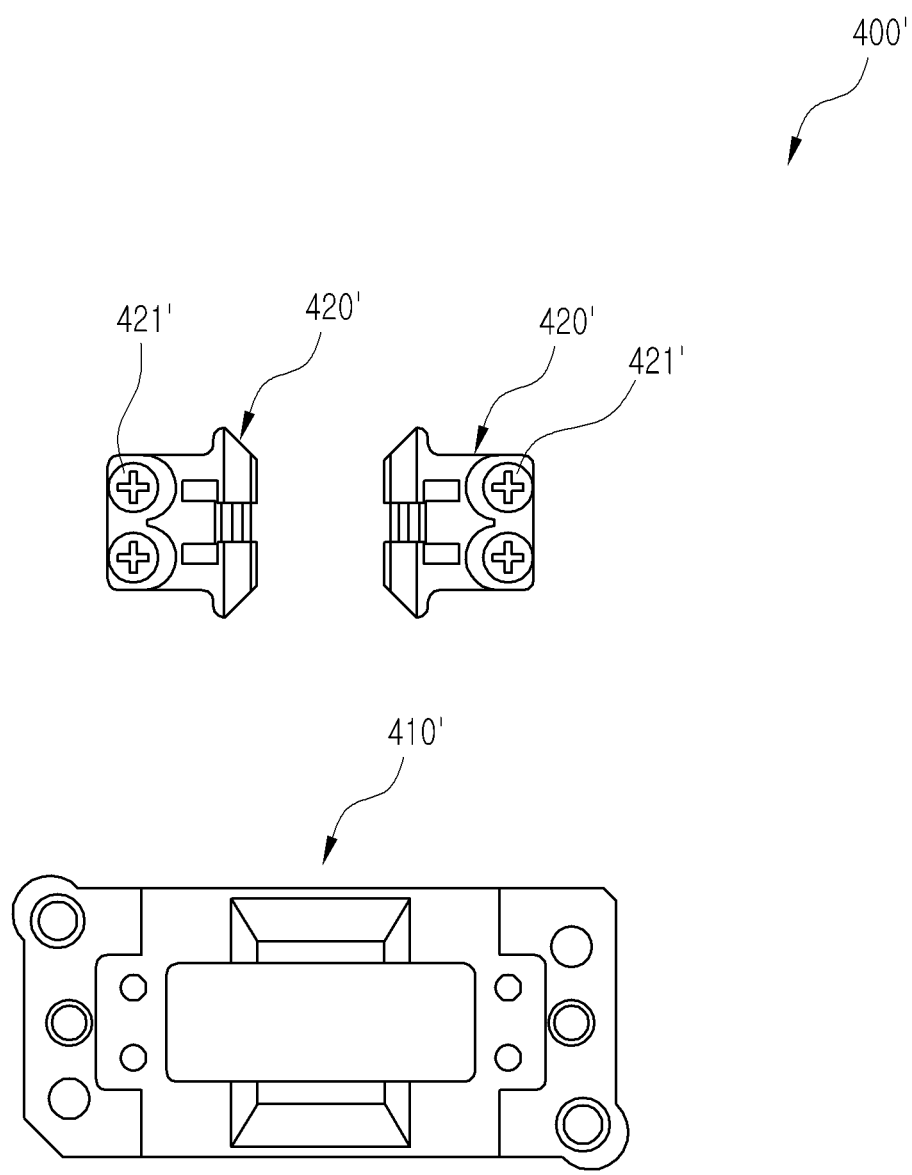
FIG. 8 and FIG. 9 are plan views and cross-sectional views illustrating a modified embodiment of the insert of FIG. 4.
Figure 9:
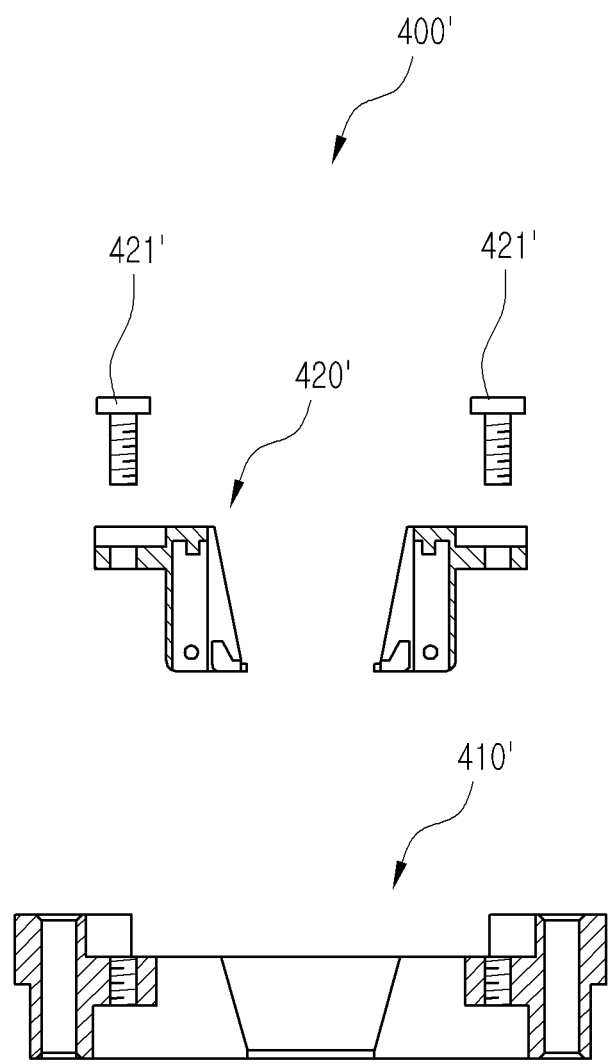

The present embodiment applies a certain coupling mechanism to the latch block 420 and the insert body 410, however, it should be understood that the embodiment can be modified, as shown in FIG. 8 and FIG. 9, in such a way that a latch block 420' can be detachably coupled to an insert body 410' using another element, such as, a bolt 421'.

Second Aspect of the Present Invention

First Embodiment

FIG. 10 is a partially cut-away perspective view illustrating a first embodiment of an insert 1100 in accordance with a second aspect of the present invention.

The insert 1100 is configured to include an insert body 1110 and an insert pocket 1120.

The insert body 1110 includes a housing 1111 and a pair of latch units 1112.

The housing 1111 is configured to include a through-hole 1111a for allowing a semiconductor device D to pass therethrough when the semiconductor device D is lowered, for loading, from the upper direction to the lower direction, i.e., in the Z-direction, hook receiving grooves 1111b formed at the right side and the left side of the through-hole 1111a, for receiving hooks 1122, which will be descried later, and hook catching jaws 1111c for catching the hooks 1122.

The pair of latch units 1112 (the rear latch unit is not shown in the drawings) are installed on the housing 1111 to both the front side and the rear side of the through-hole 1111a.

The latch unit 1112 includes a latch bar 1112a whose one end is pivotally coupled to the housing 1111 and whose opposite end rotates with respect to the one end operating as a rotation axis. The latch bar 1112a holds or releases a semiconductor device loaded onto the insert pocket 1120 as the opposite end is rotated.

The insert pocket 1120 is detachably coupled to the insert body 1110 in such a way as to be movable in the upper and lower directions. The insert pocket 1120 has a loading frame 1121 shaped in an approximately rectangular form, and a pair of hooks 1122 located at both the right side and left side of the loading frame 1121.

The loading frame 1121 includes a loading part 1121a having an separating prevention jaw 1121a-1 that prevents a semiconductor device D loaded onto the bottom of the loading frame 1121 from moving downward.

The pair of hooks 1122 is fixed to or integrally formed with the loading frame 1121. The hooks 1122 are received in the hook receiving grooves 1111b and hanged on the hook catching jaws 1111c.

The following is a description of the use state of the insert 1100.

Referring to FIG. 11, when an external force is applied to the insert pocket 1120 from the lower direction to the upper direction, the loading frame 1121 is lifted up and pushes the latch bar 1112a, so that the opposite end of the latch bar 1112a is pivotally lifted up and rotated with respect to the one end of the latch bar 1112a. Thus, the loading part 1121a is opened or the holding state of the semiconductor device D loaded onto the loading part 1121a is released. That is, the semiconductor device D can be loaded onto or unloaded from the loading part 1121a.

When the external force is removed, the insert pocket 1120 is lowered to the lower direction by gravity and an elastic force of a spring (not shown) included in the latch unit 1112. In addition, the opposite end of the latch bar 1112a is lowered and rotated with respect to the one end of the latch bar 1112a to close the loading part 1121*a* or to hold a semiconductor device D loaded onto the loading part 1121*a*, as shown in FIG. 10.

In the first embodiment of an insert 1100, when the hooks 1122 are damaged, only the insert pocket 1120 is replaced and the insert body 1110 can be reused.

The first embodiment of an insert 1100 is implemented in such a way as to include the latch unit 1112 that is operated by lifting up or lowering the insert pocket 1120, however, it should be understood that the first embodiment can be modified to employ an latch unit that is operated by pressure of a lower position determination unit, similar to the latch unit of cited art 1. In this case, the insert pocket does not need to be lifted up or lowered and accordingly is fixed to the insert body.

Second Embodiment

Figure 12:
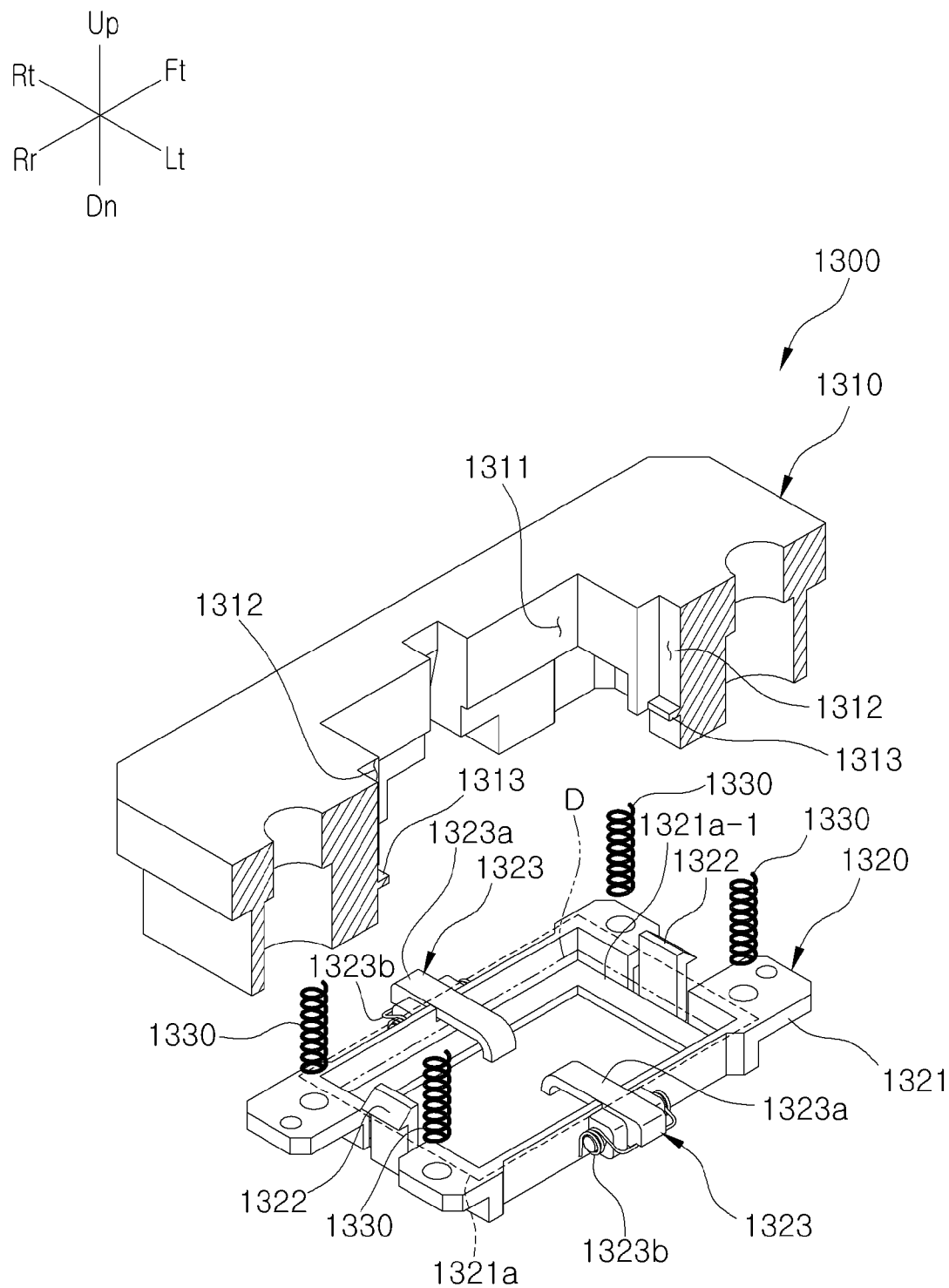
FIG. 12 is a partially cut-away, disassembled perspective view illustrating a second embodiment of an insert in accordance with a second aspect of the present invention.

FIG. 12 is a partially cut-away, disassembled perspective view illustrating a second embodiment of an insert 1300 in accordance with a second aspect of the present invention. FIG. 13 and FIG. 14 are partially cut-away perspective views of the second embodiment of the insert 1300 of FIG. 12.

As shown in FIG. 12, the insert 1300 is configured to include an insert body 1310, an insert pocket 1320, and a compression spring 1330.

The insert body 1310 is configured to include a through-hole 1311 for allowing a semiconductor device D to pass therethrough when the semiconductor device D is lowered, for loading, from the upper direction to the lower direction, hook receiving grooves 1312 formed at the front side and the rear side of the through-hole 1311, for receiving hooks 1322, which will be described later, and hook catching jaws 1313 for catching the hooks 1322. As shown in FIG. 14, latch catching jaws 1314 are also formed at both the right side and the left side of the through-hole 1311, which will be described in detail later.

The insert pocket 1320 is detachably coupled to the insert body 1310 in such a way as to be movable in the upper and lower directions. The insert pocket 1320 has a loading frame 1321 shaped in an approximately rectangular form, a pair of hooks 1322 located at both the front side and the rear side of the loading frame 1321, and a pair of latch units 1323 installed to both the right side and left side of the loading frame 1321.

The loading frame 1321 includes a loading part 1321*a* having a separating prevention jaw 1321*a*-1 that prevents a semiconductor device D loaded onto the bottom of the loading frame 1321 from moving downward.

The pair of hooks 1322 are fixed to or integrally formed with the loading frame 1321. The hooks 1321 are received in the hook receiving grooves 1312 and hanged on the hook catching jaws 1313.

The latch unit 1323 is configured to include a latch bar 1323*a* and a holding spring 1323*b*.

Two latch bars 1323*a* of the pair of latch units 1323 are pivotally coupled to both the right side and the left side of the loading frame 1321, respectively. One end of each of the latch bars 1323*a* is rotated with respect to the pivot, which functions as a hinge joint, pivotally coupled to the loading frame 1321 to hold or release the semiconductor device D loaded onto the loading part 1321*a*. The opposite ends of the latch bars 1323*a* extend a certain length in the lengthwise direction of the latch bar 1323*a*, respectively, so that the extended portions of the opposite ends can be caught to the latch catching jaws 1314 when the insert pocket 1320 is lifted up by an external force, as shown in FIG. 14.

The holding spring 1223*b* is implemented by a torsion spring that applies an elastic force to the latch bar 1323*a* so that the latch bar 1323*a* can hold the semiconductor device D loaded onto the loading part 1321*a* when an external force does not exist.

The compression spring 1330 applies a repulsive elastic force between the insert body 1310 and the insert pocket 1320 when an external force does not exist.

The following is a description of the use state of the insert 1300.

Figure 15:
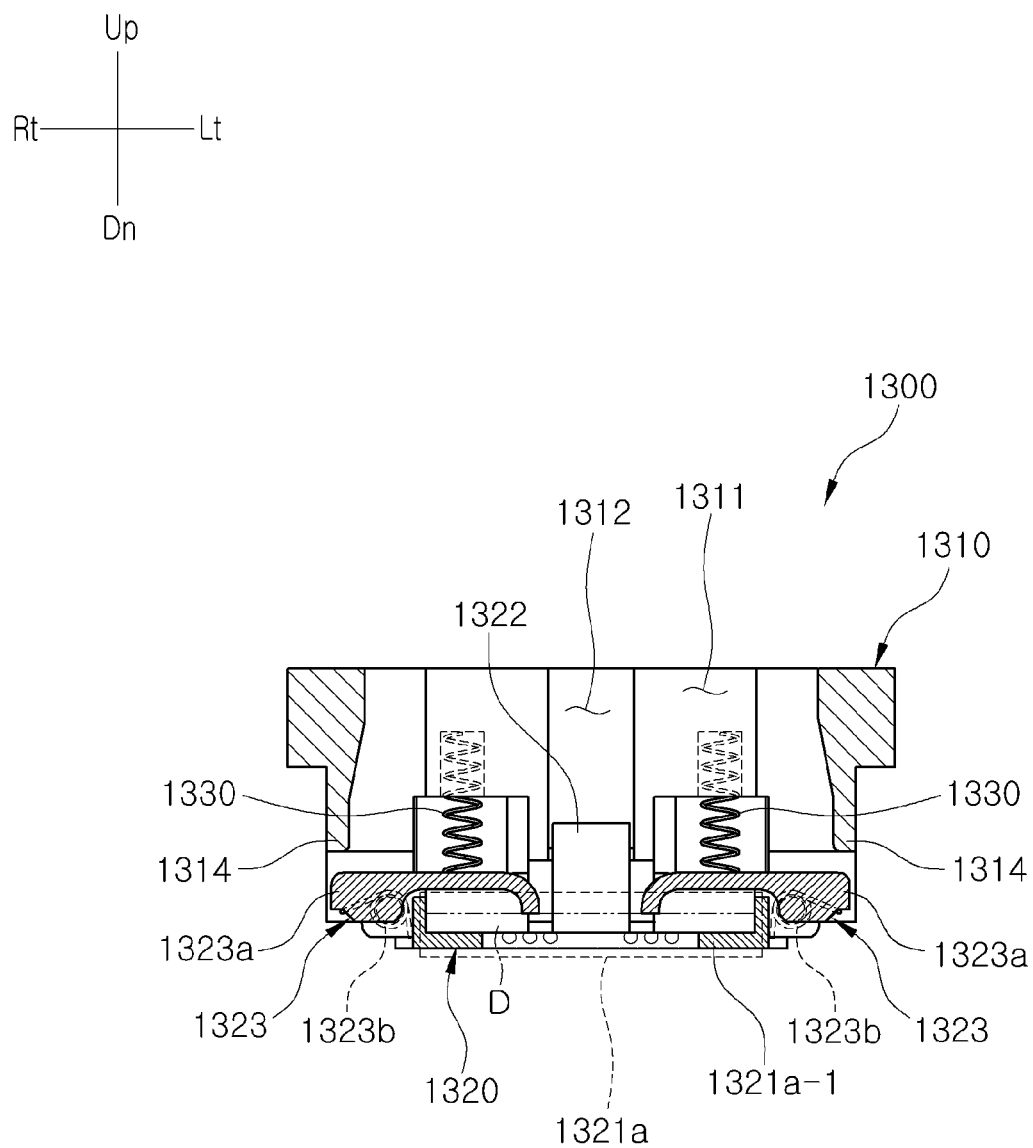
Figure 16:
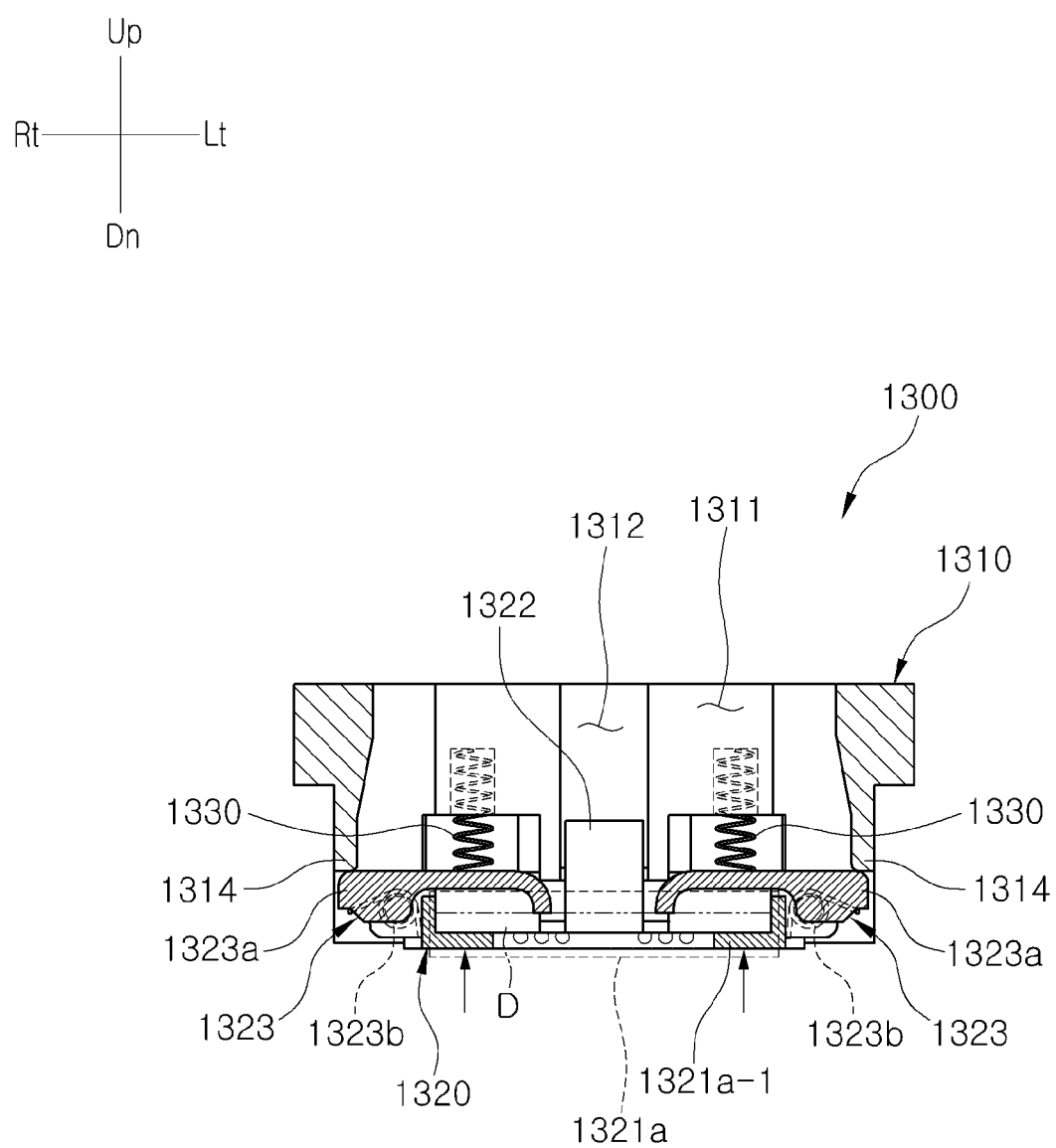

When an external force is applied to the insert pocket 1320, in a state as shown in FIG. 15, from the lower direction to the upper direction, the insert pocket 1320 is lifted up, and thus the opposite ends of the latch bars 1323*a* are caught to the latch catching jaws 1314, respectively, as shown in FIG. 16.

When the external force is continuously exerted on the insert pocket 1320 in the state of FIG. 16, the insert pocket 1302 is lifted up higher, so that the one end of each of the latch bars 1323*a* is pivotally lifted up and rotated with respect to the pivot, the hinge joint, with the opposite end of each of the latch bars 1323*a* are caught by the latch catching jaws 1314. Thus, as shown in FIG. 17, the loading part 1321*a* is opened or the holding state of the semiconductor device D loaded onto the loading part 1321*a* is released. That is, the semiconductor device D can be loaded onto or unloaded from the loading part 1321*a*.

When the external force is removed, the insert pocket 1320 is lowered to the lower direction by gravity and an elastic force of the compression spring 1330. In addition, the latch bars 1323*a* are reversely rotated by the elastic force of the holding spring 1323*b* and return the state to close the loading part 1321*a* or to hold a semiconductor device D loaded onto the loading part 1321*a*, as shown in FIG. 15.

In the second embodiment, when the latch unit 1323 is broken down, only the insert pocket 1320 needs to be replaced, so that the insert 1300 can be easily recovered.

Third Embodiment

FIG. 18 is a perspective view illustrating an insert pocket 1920 adapted to a third embodiment of an insert in accordance with a second aspect of the present invention.

The insert pocket 1920 is configured to have a bottom 1921*a*-1 in a loading part 1921*a*. The bottom 1921*a*-1 forms a plurality of holes 1921*a*-1*a* thereon, which is spaced apart from each other at a certain distance. The third embodiment is implemented in such a way that a plurality of holes 1921*a*-1*a* are formed in the entire area of the bottom 1921*a*-1, however, it should be understood that the embodiment can be modified in such a way that the plurality of holes 2021*a*-1*a* are formed within a certain area A on the basis of the center point O, as shown in FIG. 19, if the maximum size of semiconductor devices to be tested is acceptable.

The bottom 1921*a*-1 forms a position groove 1921*a*-1*b* thereon, which corresponds to the protrusion portion formed on the bottom surface of the semiconductor device. That is, the protrusion portion of the semiconductor device is fitted onto the position groove 1921*a*-1*b* so as to hold the semiconductor device. The third embodiment is implemented in such a way that the position groove 1921*a*-1*b* is formed as a liner zone from one end to the opposite end of the bottom 1921*a*-1, however, it should be understood that the position groove can be formed in such a way to correspond to the shapes and positions of the protrusion portions of semiconductor devices.

Figure 21:
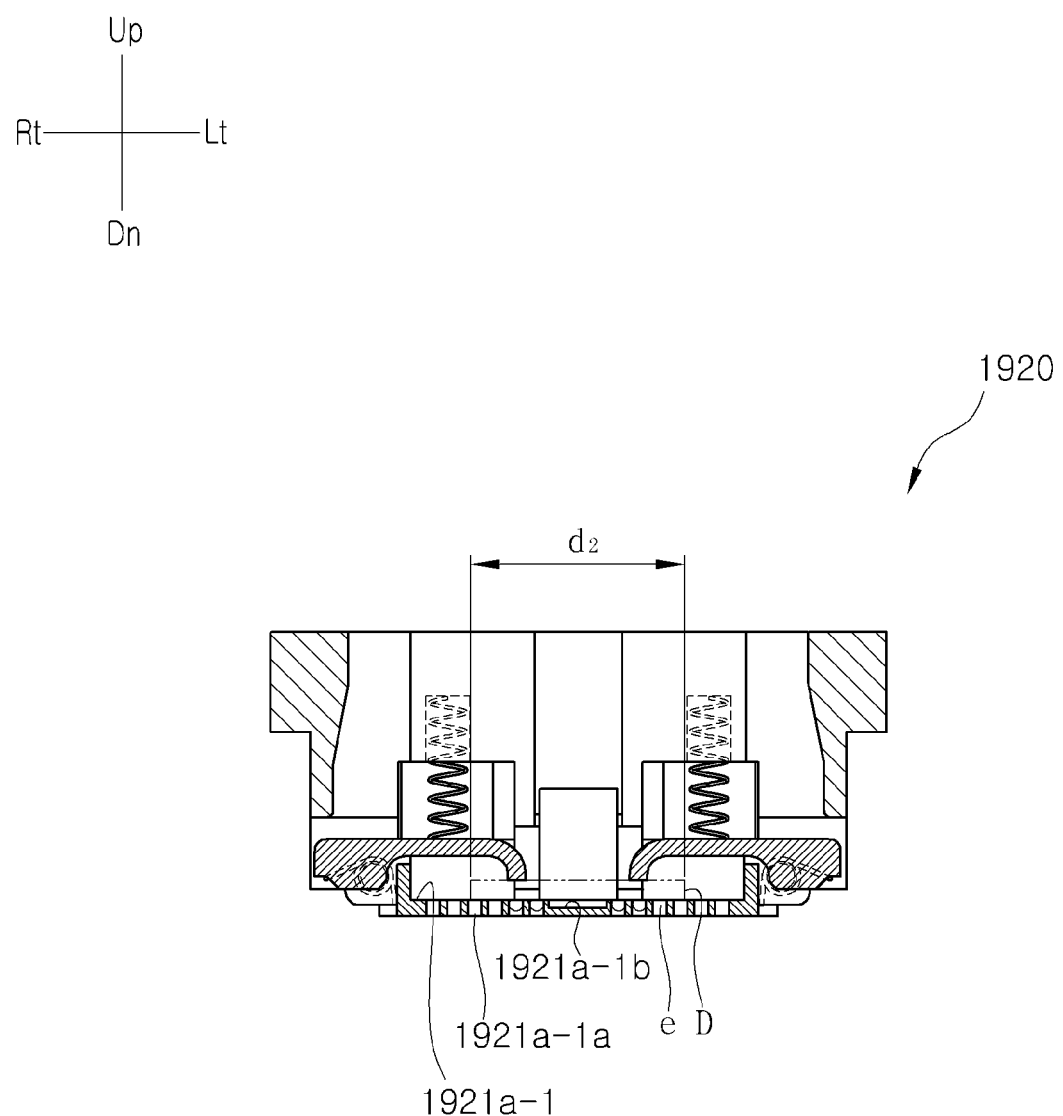

The following is a description of operations of the holes 1921*a*-1*a* and the position groove 1921*a*-1*b* referring to FIG. 20 and FIG. 21.

As shown in FIG. 20, when a semiconductor device D whose size is d1 is located at the bottom 1921*a*-1, the protrusion portion of the semiconductor device D is fitted onto the position groove 1921a-1b and a plurality of leads e of the semiconductor device D are also inserted to the holes 1921a-1a formed in the area on which the semiconductor device D is placed, thereby holding the position of the semiconductor device D. Here, the leads e of the semiconductor device D are shaped as a ball in FIG. 20, however, they can be shaped as a line.

As shown in FIG. 21, although the semiconductor device D to be tested is replaced with small (or large) sized semiconductor devices, as for example in d2, the plurality of leads e of the replaced semiconductor device D are inserted to the holes 1921a-1a formed in the area on which the replaced semiconductor device D is placed, thereby holding the position of the replaced semiconductor device D.

Therefore, when the insert forms a position groove and a plurality of holes in the bottom of the loading part, so that the position groove and the plurality of holes can correspond to the standardized protrusion portion of and the standardized spacing between the leads of the semiconductor devices, respectively, the insert and the insert pocket do not need to be replaced, although the semiconductor devices are replaced with different sized semiconductor devices.

The plurality of holes 1921a-1a are formed in the insert pocket 1920 in the embodiment of the present invention, however, it should be understood that the present invention may be applied to cited art 1 in such a way that the plurality of holes can be formed, spaced apart from each other at a certain distance, in the bottom of the loading part of the conventional integral type insert, in which the conventional integral type insert means an insert in which the insert body and the insert pocket are formed as a single body.

Although the embodiments are individually described based on the features of the present invention, it should be understood that all of the features can also be applied to one insert and this may become another embodiment of the present invention.

In addition, the embodiments of the present invention are implemented in such a way to include the latch units as a pair, however, it should be understood that they can be configured by one latch unit only if a semiconductor device can be appropriately held in and released from the loading part. Also, the present invention may be implemented by three or more latch units.

Furthermore, the embodiments of the present invention are implemented in such a way to include the hooks as a pair, however, it should be understood that they can be configured by one hook only if the insert pocket can be detachably coupled to the insert body in such a way so as to move freely. Also, the present invention may be implemented by three or more hooks.

As described in the foregoing, the present invention has the following effects:

First, since the latch block, formed as a module, for holding semiconductor devices placed into the placing compartments can be detachably coupled to the insert body, it can be easily replaced and can be also reused regardless of whether current semiconductor devices are replaced with different sized semiconductor devices, thereby preventing resources from being wasted.

Second, when the hooks are damaged, only the insert pocket can be replaced, which can allow the insert body to be reused and prevents resources from being wasted. Also, since the latch unit, which tends to be easily broken down and is difficult to be replaced because disassembling and installing processes are difficult, is installed in the insert pocket, when the latch unit is broken, only the insert pocket can be easily replaced, thereby efficiently performing the replacement operation. In addition, even though the semiconductor devices to be tested are replaced with different sized semiconductor devices, the insert can be reused, thereby reducing the wastage of resources and saving money by eliminating replacement costs.

Although exemplary embodiments of the present invention have been described in detail hereinabove, it should be understood that many variations and modifications of the basic inventive concept herein described, which may appear to those skilled in the art, will still fall within the spirit and scope of the present invention as defined in the appended claims and their equivalents.

What is claimed is:

1. An insert for a test handler, the insert comprising:
    an insert body having a placing compartment in which a semiconductor device is placed; and
    a pair of latch blocks for holding the semiconductor device placed in the placing compartment, wherein the pair of latch blocks are detachably coupled to the insert body, each latch block comprising a latch and parts for operating the latch,
    wherein the insert body includes two block receiving openings formed on opposite ends of the placing compartment and receiving the pair of latch blocks therein, a catching jaw and a protrusion for preventing the pair of latch blocks from being removed in an upward direction, and a downward direction,
    wherein the insert body forms the catching jaw on the inner wall of a block receiving opening,
    wherein the pair of latch blocks are each received in the block receiving openings of the placing compartment, separately and respectively,
    wherein the pair of latch blocks are configured in such a way that each latch block includes the latch for holding the semiconductor device placed in the placing compartment and the parts for operating the latch, where the latch and the parts for operating the latch are integrally assembled in the latch block,
    wherein the latch blocks comprise predetermined physical dimensions according to physical dimensions of a plurality of insert bodies in each of which different dimensional semiconductor devices are placed, and wherein the predetermined physical dimensions concurrently avoid interference with each of the plurality of insert bodies, so that the pair of latch blocks can be reused with the different dimensional semiconductor devices and the plurality of insert bodies, and
    wherein the pair of latch blocks form a catching boss that is elastically and movably caught to the catching jaws to prevent the pair of latch blocks from separating when the latch block is received in the block receiving opening.

2. The insert according to claim 1, wherein the pair of latch blocks are detachably coupled to the insert body through a coupling member.

* * * * *